United States Patent
Ramaswamy et al.

(10) Patent No.: US 9,343,674 B2
(45) Date of Patent: May 17, 2016

(54) CROSS-POINT MEMORY UTILIZING RU/SI DIODE

(71) Applicant: MICRON TECHNOLOGY, INC., Boise, ID (US)

(72) Inventors: Nirmal Ramaswamy, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/456,177

(22) Filed: Aug. 11, 2014

(65) Prior Publication Data

US 2014/0346424 A1 Nov. 27, 2014

Related U.S. Application Data

(60) Continuation of application No. 13/793,150, filed on Mar. 11, 2013, now Pat. No. 8,803,125, which is a division of application No. 12/883,314, filed on Jul. 9, 2010, now Pat. No. 8,395,140.

(51) Int. Cl.
| | |
|---|---|
| *H01L 47/00* | (2006.01) |
| *H01L 45/00* | (2006.01) |
| *H01L 27/24* | (2006.01) |
| *G11C 13/00* | (2006.01) |

(52) U.S. Cl.
CPC ............... *H01L 45/14* (2013.01); *H01L 27/24* (2013.01); *H01L 27/2409* (2013.01); *H01L 27/2481* (2013.01); *H01L 45/04* (2013.01); *H01L 45/1226* (2013.01); *H01L 45/145* (2013.01); *G11C 13/0004* (2013.01)

(58) Field of Classification Search
CPC ....... H01L 45/04; H01L 27/24; H01L 25/145; H01L 27/101; H01L 29/872; H01L 29/475; H01L 29/00; H01L 29/47; G11C 13/0007; G11C 13/0004
USPC ........ 257/4, 5, 73, 473, E45.001, 3; 365/104, 365/163, 171, 218
See application file for complete search history.

(56) References Cited

U.S. PATENT DOCUMENTS

| | | | |
|---|---|---|---|
| 3,838,405 | A | 9/1974 | Arnett et al. |
| 4,488,262 | A | 12/1984 | Basire et al. |
| 5,162,263 | A | 11/1992 | Kunishima et al. |
| 5,311,039 | A * | 5/1994 | Kimura et al. ................. 257/50 |
| 5,640,343 | A | 6/1997 | Gallagher et al. |

(Continued)

FOREIGN PATENT DOCUMENTS

| | | |
|---|---|---|
| CN | 101068023 A | 11/2007 |
| JP | 2000101100 A | 4/2000 |

OTHER PUBLICATIONS

Chinese Office Action and Search Report for CN Application No. 201180034046.X, mailed Mar. 18, 2015, 5 pages.

(Continued)

*Primary Examiner* — Thinh T Nguyen
(74) *Attorney, Agent, or Firm* — Dicke, Billig & Czaja, PLLC

(57) ABSTRACT

Memory devices utilizing memory cells including a resistive element and a diode coupled in series between two conductors. The diodes include a ruthenium material and a silicon material. The diodes further include an interface of ruthenium or ruthenium silicide between the silicon material and the ruthenium material.

20 Claims, 16 Drawing Sheets

(56) References Cited

U.S. PATENT DOCUMENTS

| | | | |
|---|---|---|---|
| 6,570,795 | B1 | 5/2003 | Fricke et al. |
| 6,750,540 | B2 | 6/2004 | Kim |
| 6,787,833 | B1 | 9/2004 | Fishburn |
| 6,858,481 | B2 | 2/2005 | Krieger et al. |
| 6,888,773 | B2 * | 5/2005 | Morimoto .................... 365/218 |
| 7,002,197 | B2 | 2/2006 | Perner et al. |
| 7,176,064 | B2 | 2/2007 | Herner |
| 7,408,212 | B1 | 8/2008 | Luan et al. |
| 7,674,665 | B2 | 3/2010 | Park et al. |
| 8,013,363 | B2 * | 9/2011 | Bertin .................... B82Y 10/00 257/206 |
| 2005/0226067 | A1 | 10/2005 | Herner et al. |
| 2006/0250836 | A1 | 11/2006 | Herner et al. |
| 2006/0273298 | A1 | 12/2006 | Petti |
| 2008/0014750 | A1 | 1/2008 | Nagashima |
| 2008/0090307 | A1 | 4/2008 | Xiao et al. |
| 2008/0157127 | A1 * | 7/2008 | Bertin .................... B82Y 10/00 257/209 |
| 2008/0197336 | A1 | 8/2008 | Yim et al. |
| 2009/0017577 | A1 | 1/2009 | An et al. |
| 2009/0032817 | A1 | 2/2009 | Li et al. |
| 2009/0116272 | A1 | 5/2009 | Kim et al. |
| 2009/0168507 | A1 | 7/2009 | Petti |
| 2009/0225583 | A1 | 9/2009 | Lee et al. |
| 2009/0237977 | A1 | 9/2009 | Ramani et al. |
| 2009/0283739 | A1 | 11/2009 | Kiyotoshi |
| 2010/0019221 | A1 | 1/2010 | Lung et al. |
| 2010/0090172 | A1 | 4/2010 | Celinska et al. |
| 2010/0176368 | A1 | 7/2010 | Ko et al. |
| 2010/0213433 | A1 | 8/2010 | Yamamoto et al. |
| 2010/0321979 | A1 | 12/2010 | Yasutake et al. |

OTHER PUBLICATIONS

Chinese Office Action and Search Report for CN Application No. 201180034046.X, mailed Mar. 18, 2015, 7 pages.

* cited by examiner

US 9,343,674 B2

CROSS-POINT MEMORY UTILIZING RU/SI DIODE

RELATED APPLICATIONS

This application is a Continuation of U.S. patent application Ser. No. 13/793,150, titled "CROSS-POINT MEMORY UTILIZING Ru/Si DIODE," filed Mar. 11, 2013 (allowed), which is a Divisional of U.S. patent application Ser. No. 12/833,314, titled "CROSS-POINT MEMORY UTILIZING Ru/Si DIODE," filed Jul. 9, 2010 (now U.S. Pat. No. 8,395,140), each of which is commonly assigned and incorporated herein by reference.

TECHNICAL FIELD

The present disclosure relates generally to semiconductor memories and, in particular, in one or more embodiments, the present disclosure relates to cross-point memory utilizing diodes containing ruthenium and silicon.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, for example.

Cross-point memory is generally defined by a resistive element occurring at an intersection of two conductive lines, e.g., an access line (commonly referred to as a word line) and a data line (commonly referred to as a bit line). FIG. 1 is a schematic of a portion of a basic cross-point memory array 100 having memory cells 102 occurring at intersections of the access lines 138 (e.g., word lines) and the data lines 126 (e.g., bit lines).

Each memory cell 102 of the array 100 includes a resistive element 104 coupled between an access line 138 and a data line 126. Differences in resistivity of the resistive elements 104 generally define the data value for each memory cell 102. For example, memory cells 102 having a resistive element 104 with a relatively higher resistivity may define one data value, such as a logic 0, while memory cells 102 having a resistive element 104 with a relatively lower resistivity may define a different data value, such as a logic 1. By applying a potential difference across a particular set of an access line 138 and a data line 126, a resulting current flow between the two lines can be sensed to determine whether the memory cell 102 occurring at that intersection has the relatively higher or relatively lower resistance. Differing resistivity values may be used to define more than two data states.

Cross-point memory is typically very space efficient, providing high memory density. However, in larger arrays, leakage through unselected or partially selected memory cells can become problematic. For the reasons stated above, and for other reasons stated below which will become apparent to those skilled in the art upon reading and understanding the present specification, there is a need in the art for alternative cross-point memory array architectures.

DETAILED DESCRIPTION

Figure 1:
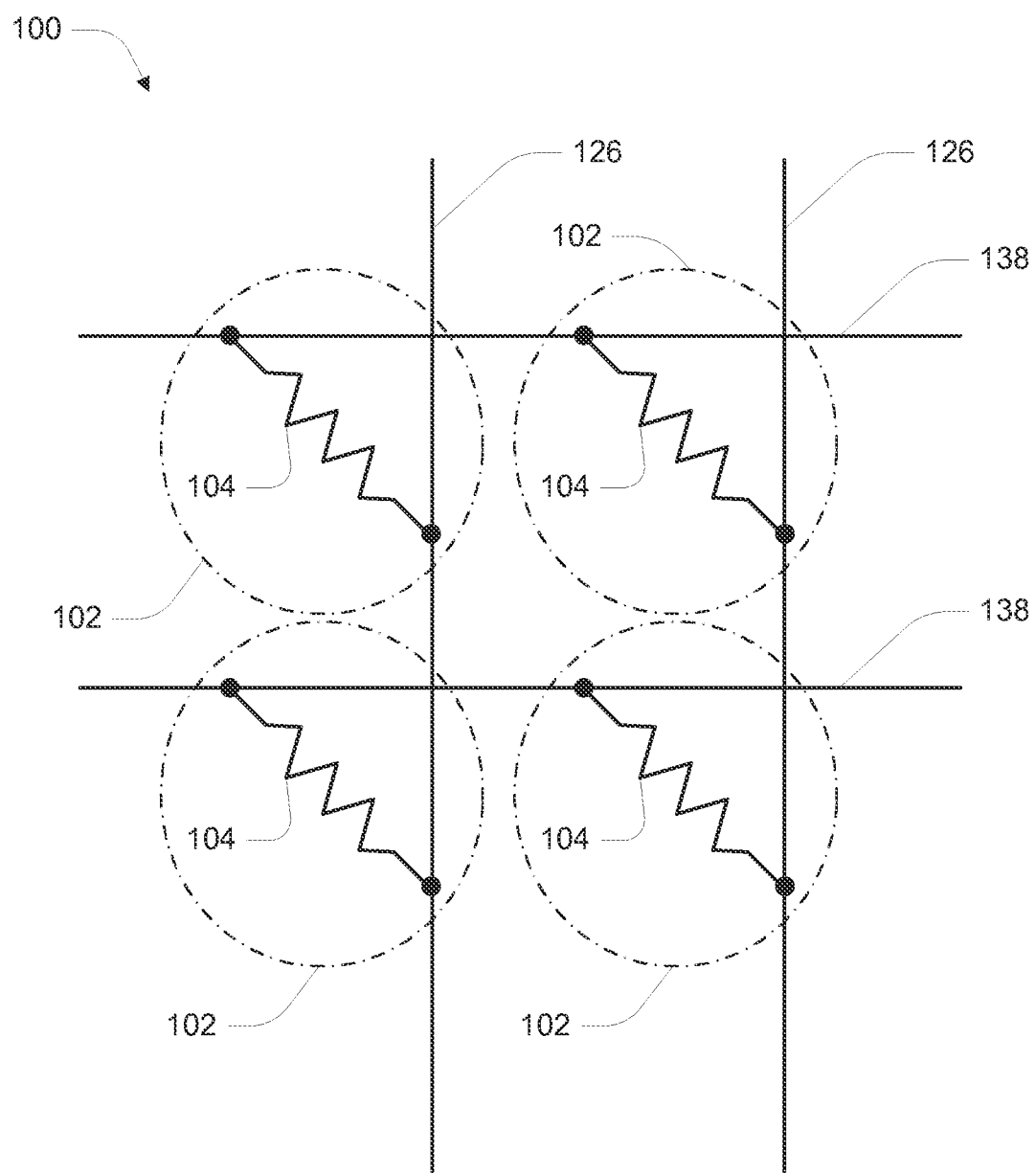
FIG. 1 is a schematic of a portion of a basic cross-point memory array.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

Various embodiments include memory cells having a resistive element coupled in series with a diode between two conductors, e.g. an access line and a data line. The diodes contain ruthenium and silicon.

Figure 2:
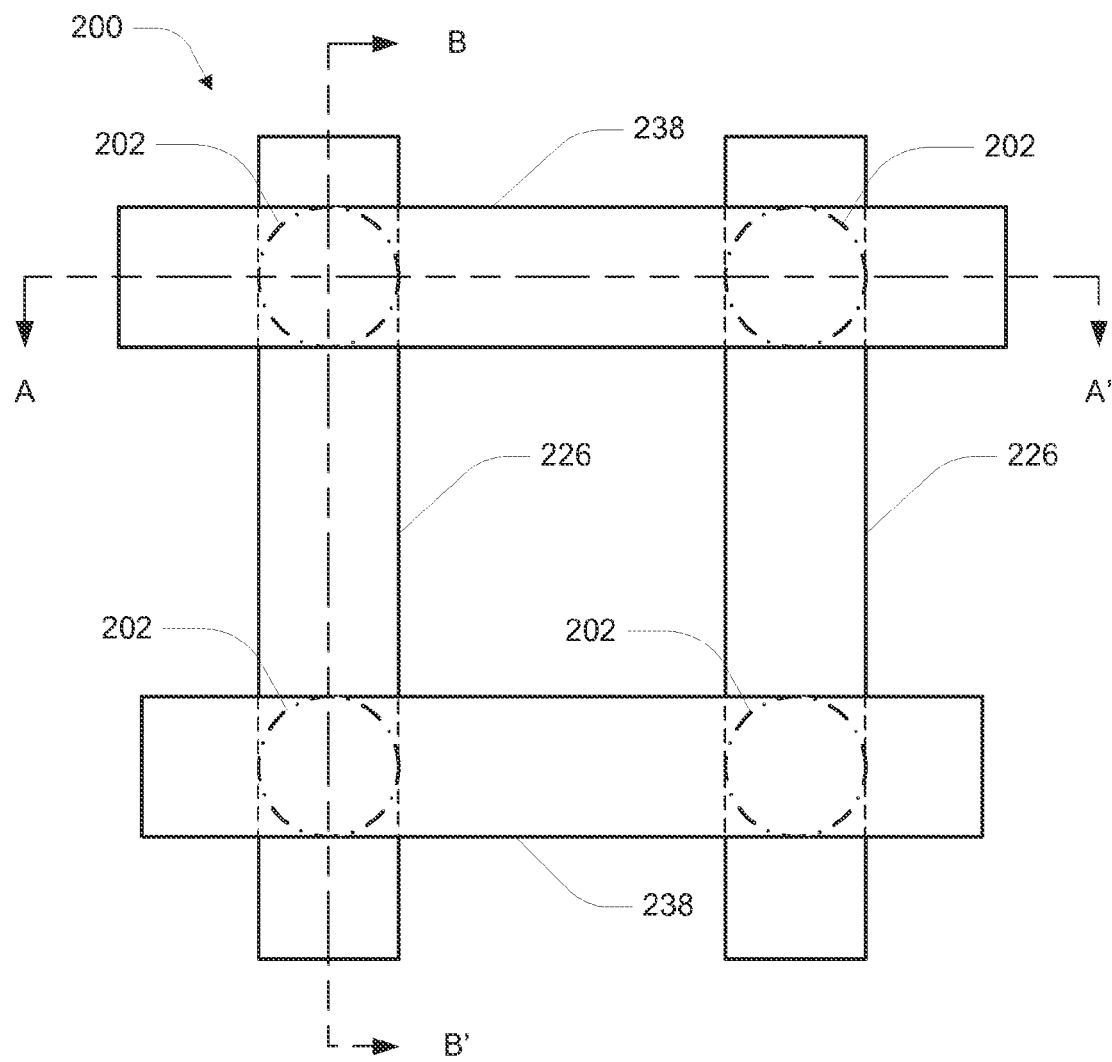
FIG. 2 is top view of a portion of a memory array in accordance with an embodiment to provide frames of reference for the discussion of FIGS. 3A-9B.

FIG. 2 is top view of a portion of a memory array 200 in accordance with an embodiment to provide frames of reference for the discussion of FIGS. 3A-9B. The memory array 200 includes memory cells 202 formed at intersections of a plurality of first conductors (e.g., data lines) 226, and a plurality of second conductors (e.g., access lines) 238. Access lines 238 and data lines 226 are generally formed in an intersecting pattern, but need not be formed orthogonal as shown in FIG. 2. Whether a conductor of the memory array 200 is an access line 238 or a data line 226 depends generally upon whether the conductor is utilized to select (e.g., activate) a memory cell 202 or utilized to sense (e.g., read) a data value of the selected memory cell 202.

Figure 3A:
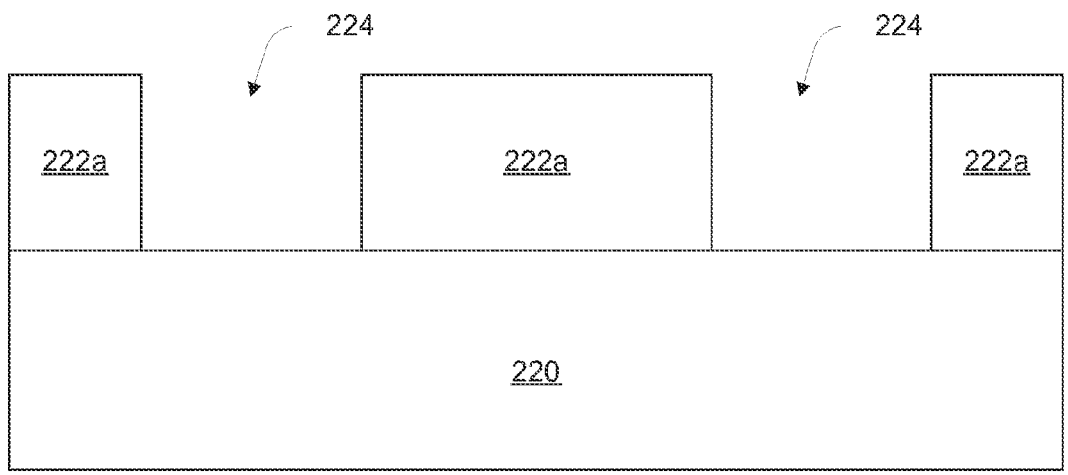
FIGS. 3A-3H depict cross-sectional views of a portion of a memory array during various stages of fabrication taken along view line A-A' of FIG. 2 in accordance with an embodiment.
Figure 4A:
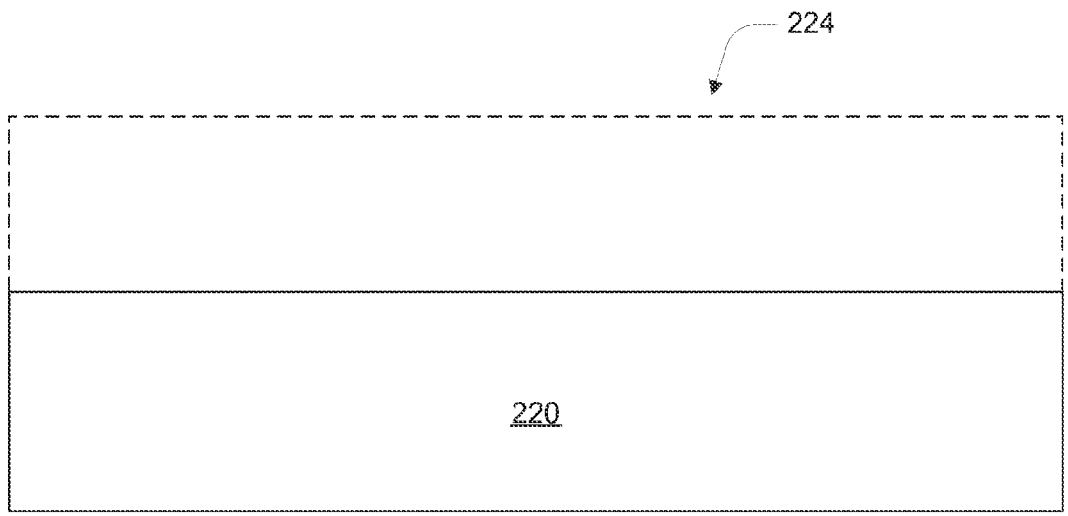
FIGS. 4A-4H depict cross-sectional views of a portion of a memory array during various stages of fabrication taken along view line B-B' of FIG. 2 in accordance with an embodiment.
Figure 3B:
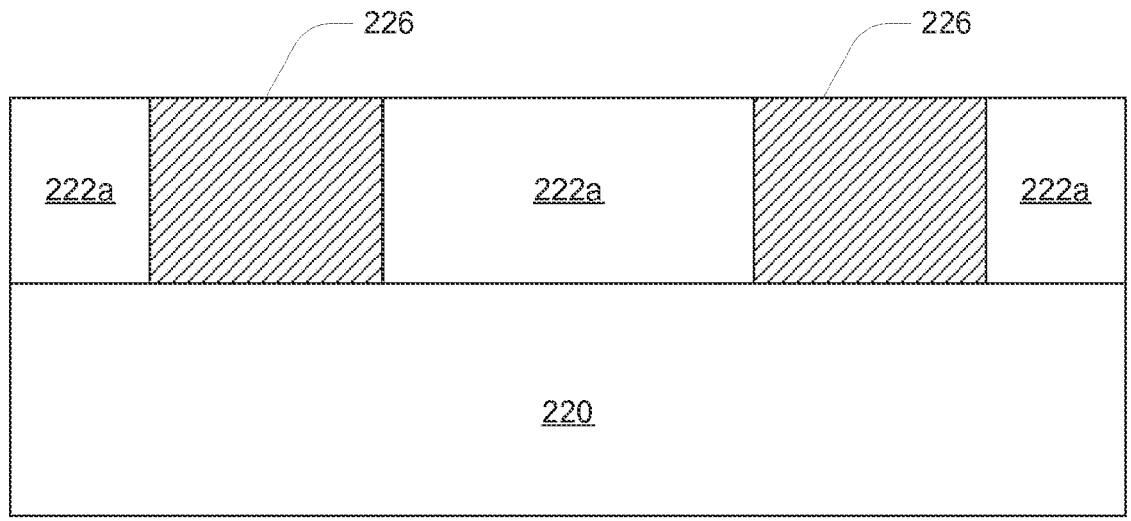
Figure 4B:
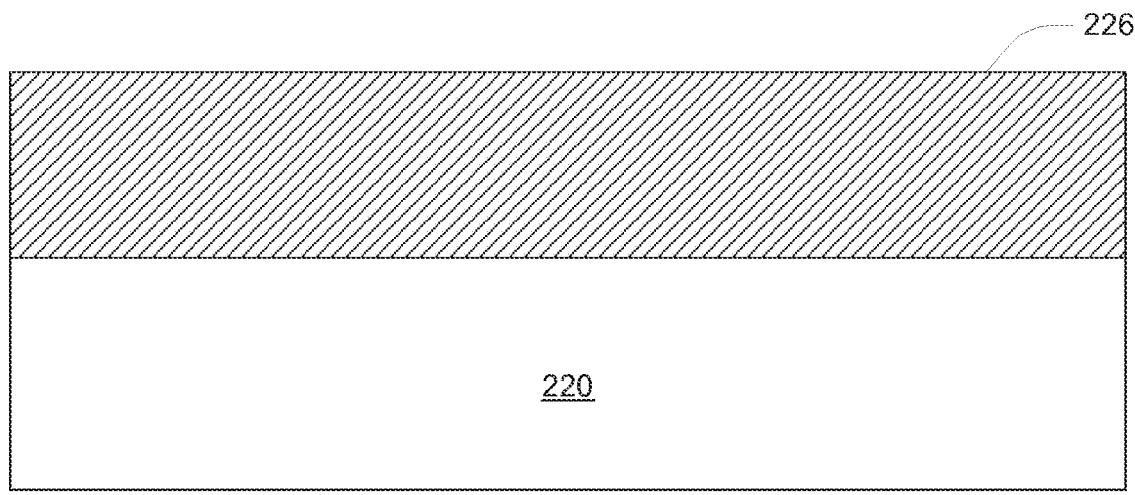

FIGS. 3A-3H depict cross-sectional views of a portion of the memory array 200 during various stages of fabrication taken along view line A-A' of FIG. 2 in accordance with an embodiment. FIGS. 4A-4H depict cross-sectional views of a portion of the memory array 200 during various stages of fabrication taken along view line B-B' of FIG. 2 in accordance with an embodiment. The cross-sectional views of FIGS. 3A-3H correspond to the cross-sectional views of FIGS. 4A-4H, such that FIGS. 3A and 4A are taken at the same stage of fabrication, FIGS. 3B and 4B are taken at the same state of fabrication, and so on.

FIGS. 3A and 4A depict a portion of a memory array after several processing steps may have occurred. In general, FIGS. 3A and 4A may depict a support 220 on which the memory array 200 will be formed. As one example, the support 220 may be a dielectric material. Example dielectric materials include a silicon oxide ($SiO/SiO_2$), silicon nitride ($SiN/Si_2N/Si_3N_4$) or silicon oxynitride (SiOxNy) material. Further examples dielectric materials include doped silicon oxide materials, such as borophosphosilicate glass (BPSG), a boron- and phosphorous-doped silicon dioxide material. Other dielectric materials are known and used in the art of semiconductor fabrication. In general, the support 220 should be chosen to generally inhibit current flow between future data lines formed thereon, and this could also be accomplished by forming isolation regions in the support 220 between adjacent data lines.

FIGS. 3A and 4A further depict a patterned dielectric 222a. The patterned dielectric 222a is generally a dielectric material. While the patterned dielectric 222a may be of the same dielectric material as the support 220, selecting different dielectric materials allows for selective removal. For example, patterned dielectric 222a may be formed by forming a dielectric material on the support 220, followed by a patterning of the dielectric material to form trenches 224 for the formation of future access lines. The trenches 224 may be formed to expose portions of the support 220, as depicted in FIGS. 3A and 4A, or the trenches 224 may be terminated before exposing portions of the support 220. By selecting different dielectric materials for support 220 and patterned dielectric 222a, the support 220 can serve as a stop layer by using a removal process that is selective to the material of the patterned dielectric 222a. To form trenches 224 terminating before exposing portions of support 220, a timed removal process may be used, for example.

In FIGS. 3B and 4B, first conductors 226 are formed. The first conductors 226 are generally formed to contain one or more conductive materials, e.g., metals, metal alloys, conductive metal nitrides, other conductive materials or some combination thereof. For example, forming first conductors 226 may include forming a barrier (not shown in FIG. 3B or 4B) on bottoms and sidewalls of the trenches 224 followed by filling the trenches 224 with a metal. For one embodiment the barrier may include forming a first metal or metal nitride to cover the bottom and sidewalls of a trench 224, and then forming a second metal to fill the trench 224 (see, e.g., barriers 225 and conductive materials 227 of FIGS. 9A and 9B, forming first conductors 226). In particular, for certain embodiments, the barrier may include tungsten, titanium nitride or tantalum as but a few examples. The barrier will generally depend on the conductive material filling the trench 224, i.e., what type of impurities or other diffusing components would the barrier be intended to mitigate. Examples of the conductive material may include copper, aluminum, tungsten, gold and/or alloys thereof. In some embodiments, a seed layer (not shown) may be used to facilitate the process of filling the trenches 224. Suitable techniques for forming the first conductors 226 may include, for example, chemical vapor deposition (CVD), physical vapor deposition (PVD), atomic layer deposition (ALD), and electroless plating. For some embodiments, the trenches 224 are filled beyond an upper surface of the patterned dielectric 222a, such as a blanket deposition process forming a conductive material over all exposed surfaces. In this situation, a chemical-mechanical planarization (CMP) process may be performed to remove portions of the conductive material extending above the upper surface of the patterned dielectric 222a.

Figure 3C:
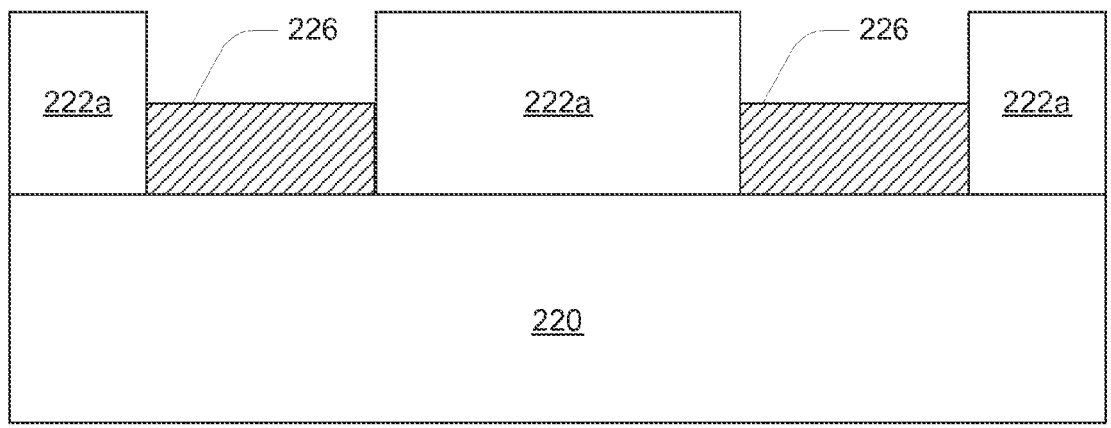
Figure 4C:
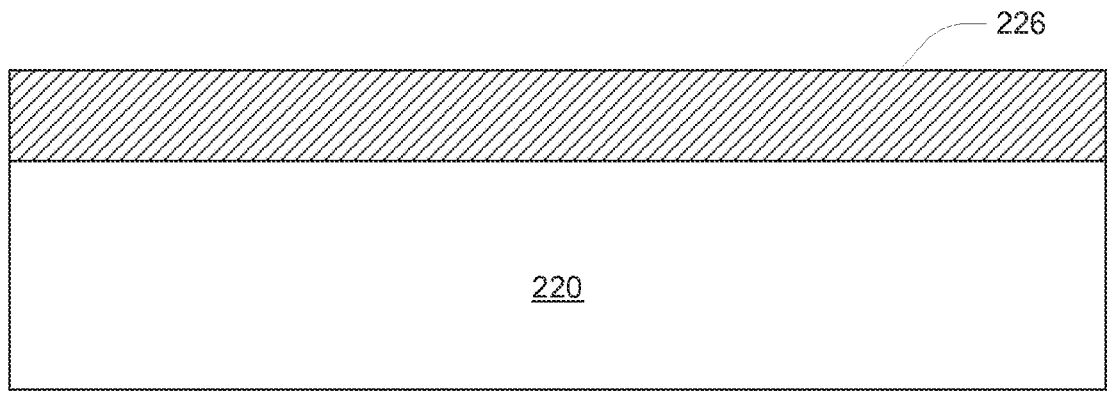

In FIGS. 3C and 4C, a portion of the first conductors 226 is removed. For example, an upper surface of the first conductors is recessed below an upper surface of the patterned dielectric 222a. An isotropic or anisotropic removal process may be used for a particular time expected to recess the first conductors 226 by a particular amount. For example, a wet etch process may be used with an etchant selective to the materials of the first conductors 226 over the patterned dielectric 222a. For one embodiment, the first conductors 226 are recessed to approximately ½ of their original height. As an alternative, the patterned dielectric 222a may be formed to the desired height of the first conductors 226, the trenches 224 could be filled, and any excess could be removed, such as by CMP.

Figure 3D:
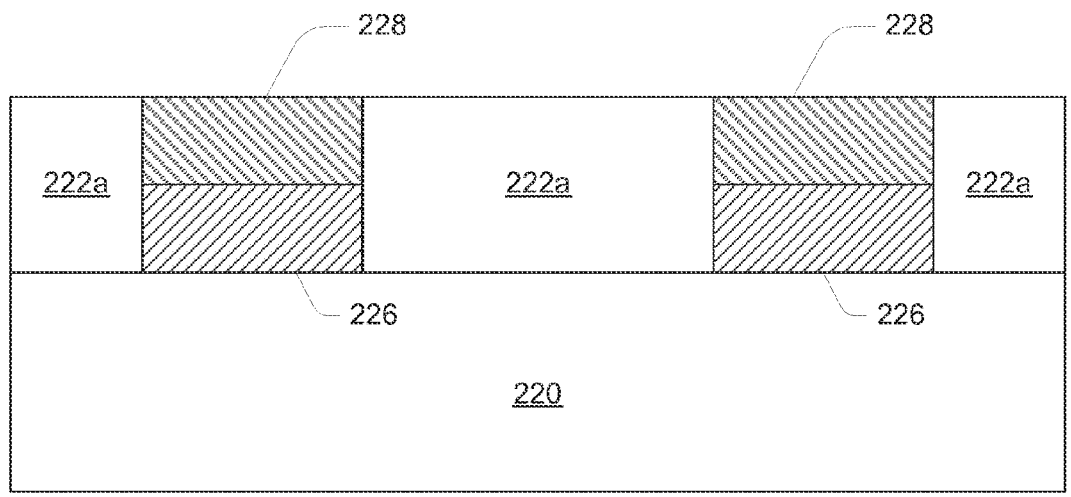
Figure 4D:
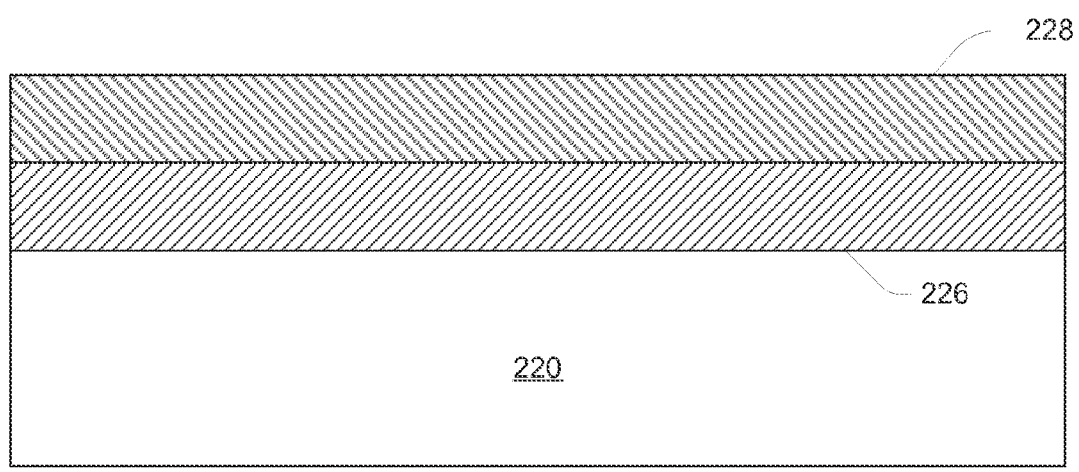

In FIGS. 3D and 4D, ruthenium material 228 is formed over the first conductors 226. For example, the portion of the trenches 224 re-opened upon removing the portion of the first conductors 226 may be filled with a material containing ruthenium (Ru). Suitable techniques for forming the ruthenium material 228 may include, for example, CVD, PVD, ALD, and electroless plating. For certain embodiments, the ruthenium material 228 is formed by sputtering from a ruthenium or ruthenium silicide ($Ru_2Si_3$) target.

For various embodiments, the ruthenium material 228 contains ruthenium at a level sufficient to make ruthenium the largest metallic component of the ruthenium material 228. For certain embodiments, the ruthenium material 228 consists essentially of elemental ruthenium. For additional embodiments, the ruthenium material 228 consists essentially of ruthenium silicide. As noted with respect to the first conductors 226, filling the trenches 224 with ruthenium material 228 may extend above an upper surface of the patterned dielectric 222a, and this excess material may be removed, such as by CMP, to planarize the surface.

Figure 3E:
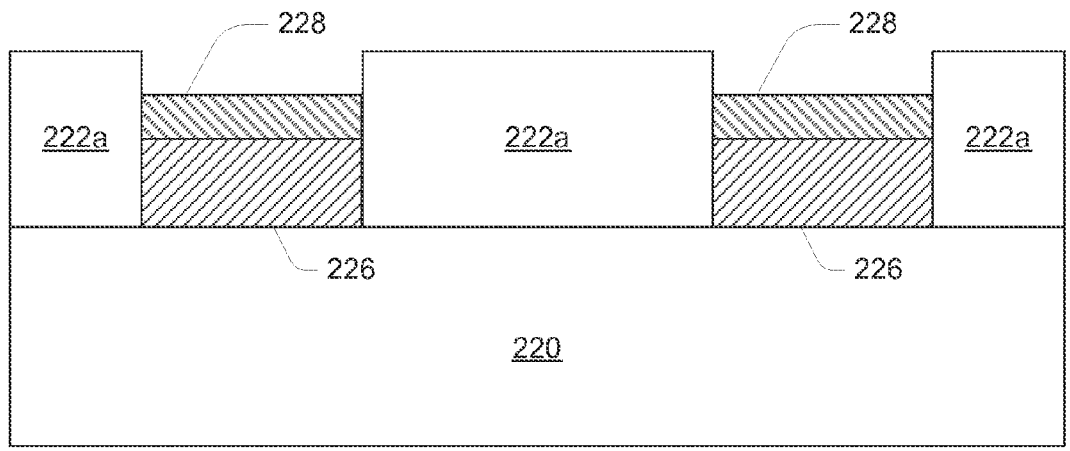
Figure 4E:
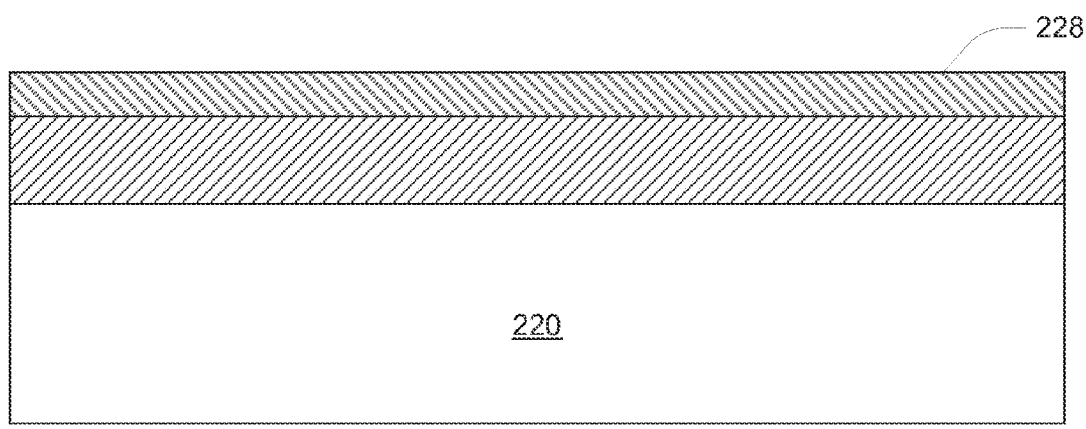

In FIGS. 3E and 4E, a portion of the ruthenium material 228 is removed. For example, an upper surface of the ruthenium material 228 is recessed below an upper surface of the patterned dielectric 222a. An isotropic or anisotropic removal process may be used for a particular time expected to recess the ruthenium material 228 by a particular amount. For example, exposure to $O_3$ or $O_2/Cl_2$ may be used to selectively remove the materials of the ruthenium material 228 over the patterned dielectric 222a. For one embodiment, the ruthenium material 228 is recessed to approximately ½ of its original height.

Figure 3F:
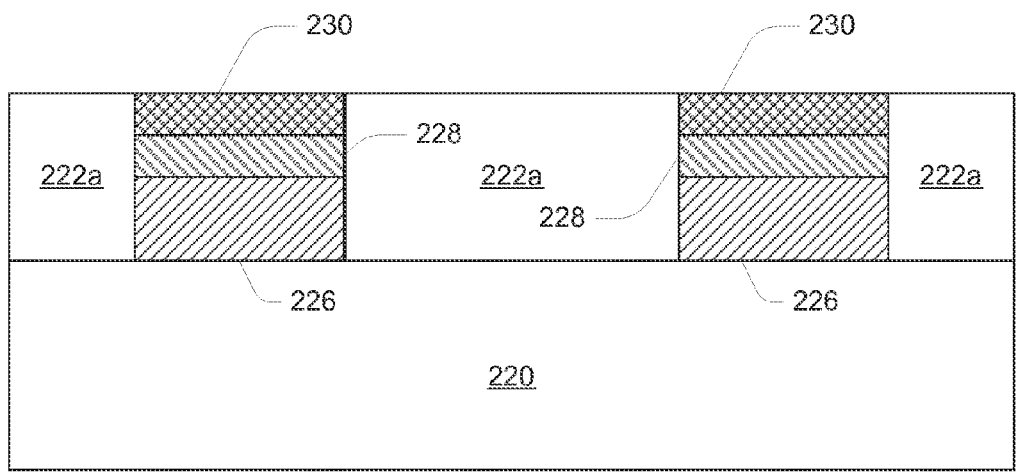
Figure 4F:
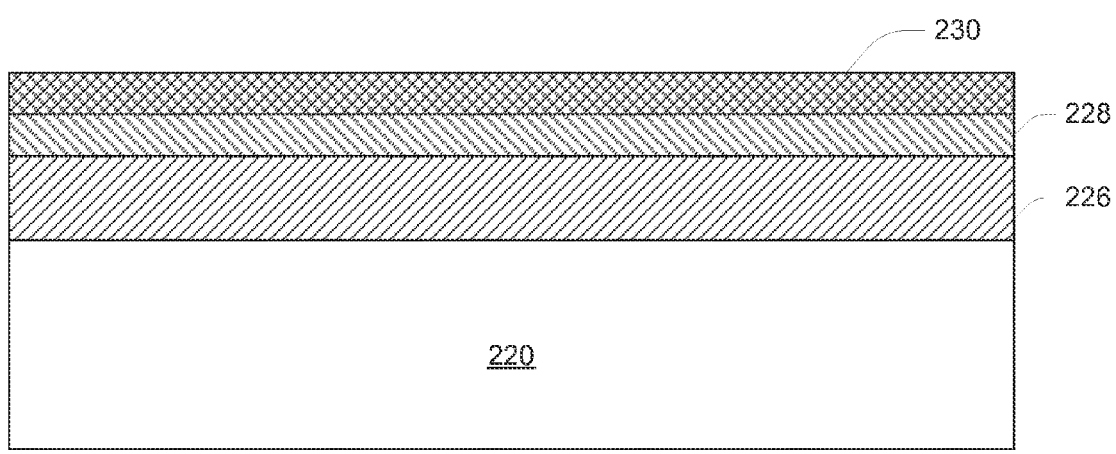

In FIGS. 3F and 4F, silicon material 230 is formed over the ruthenium material 228. For example, the portion of the trenches 224 re-opened upon removing the portion of the ruthenium material 228 may be filled with a material containing silicon (Si). Suitable techniques for forming the silicon material 230 may include, for example, CVD, PVD, and ALD. For various embodiments, the silicon material 230 contains silicon at a level sufficient to make silicon the largest component of the silicon material 230. For certain embodiments, the silicon material 230 consists essentially of monocrystalline silicon, polycrystalline silicon (i.e., polysilicon) or amorphous silicon. For additional embodiments, the silicon material 230 is conductively doped. For further embodiments, the silicon material 230 has a n-type conductivity. Providing an n-type conductivity may include doping with an n-type impurity, such as arsenic (Ar) or phosphorous (P). Such doping may occur during or after formation of the silicon material 230. As noted with respect to the first conductors 226, filling the trenches 224 with silicon material 230 may extend above an upper surface of the patterned dielectric 222a, and this excess material may be removed, such as by CMP, to planarize the surface.

Figure 3G:
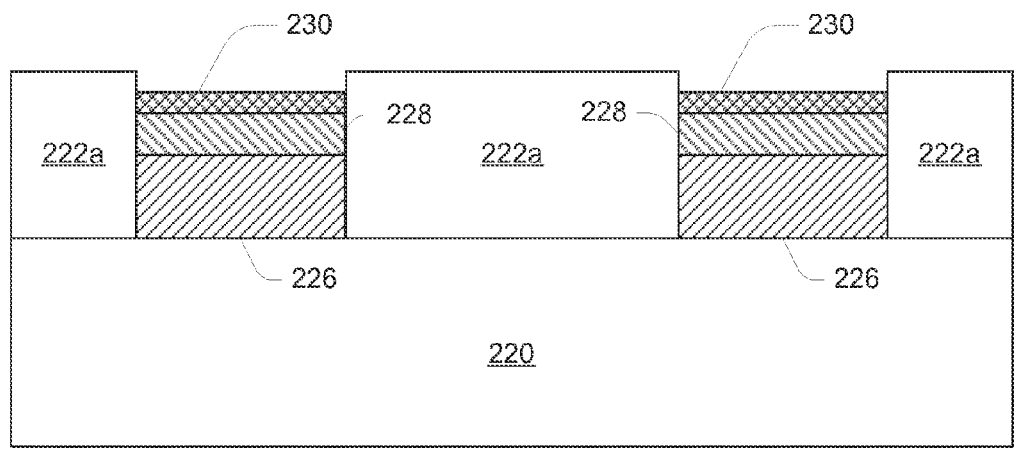
Figure 4G:
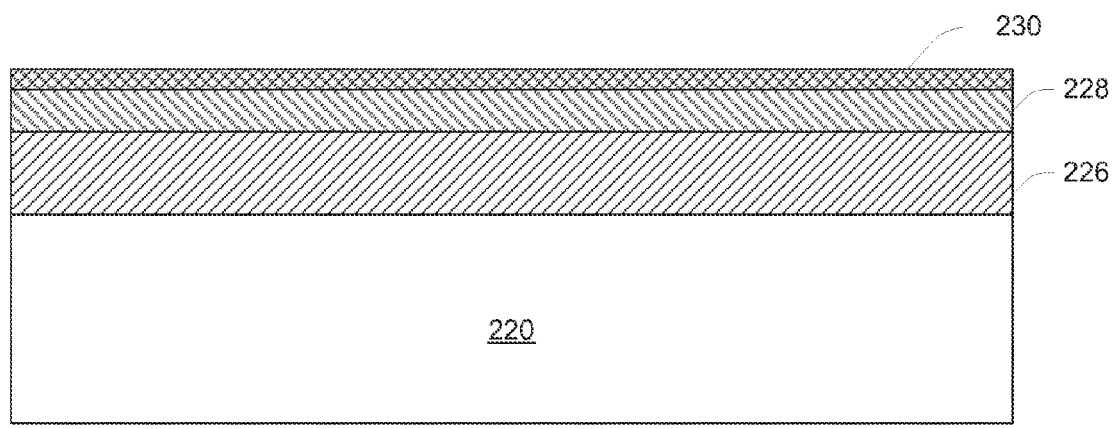

In FIGS. 3G and 4G, a portion of the silicon material 230 is removed. For example, an upper surface of the silicon material 230 is recessed below an upper surface of the patterned dielectric 222a. An isotropic or anisotropic removal process may be used for a particular time expected to recess the silicon material 230 by a particular amount. For example, a wet etch process may be used with an etchant selective to the materials of the silicon material 230 over the patterned dielectric 222a. For one embodiment, the silicon material 230 is recessed to approximately ½ of its original height. The silicon material 230 and ruthenium material 228, along with an optional ruthenium silicide interface (not shown in FIGS. 3G and 4G) formed between the ruthenium material 228 and the silicon material 230, collectively form a diode of a memory cell. For example, where the ruthenium material 228 is ruthenium and the silicon material 230 is polysilicon, the diode may have an interface of ruthenium on polysilicon for embodiments where no ruthenium silicide interface is formed after formation of the silicon material 230, or the diode may have an interface of ruthenium silicide on polysilicon formed from a reaction of the ruthenium and polysilicon. Discussion of formation of the optional ruthenium silicide interface on the silicon material 230 will follow with reference to FIG. 3J.

Figure 3H:
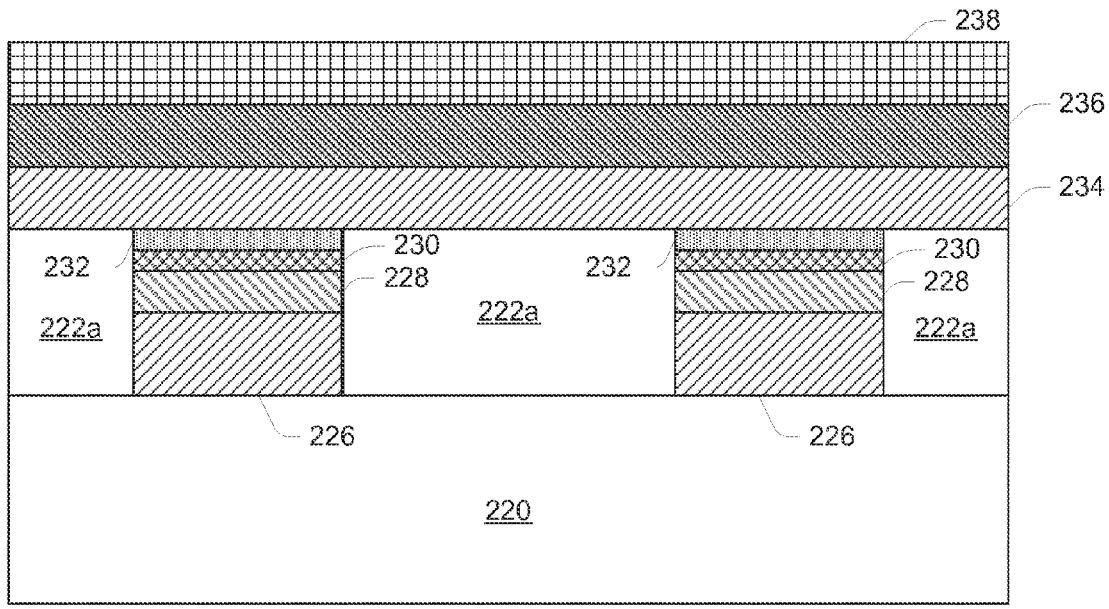
Figure 4H:
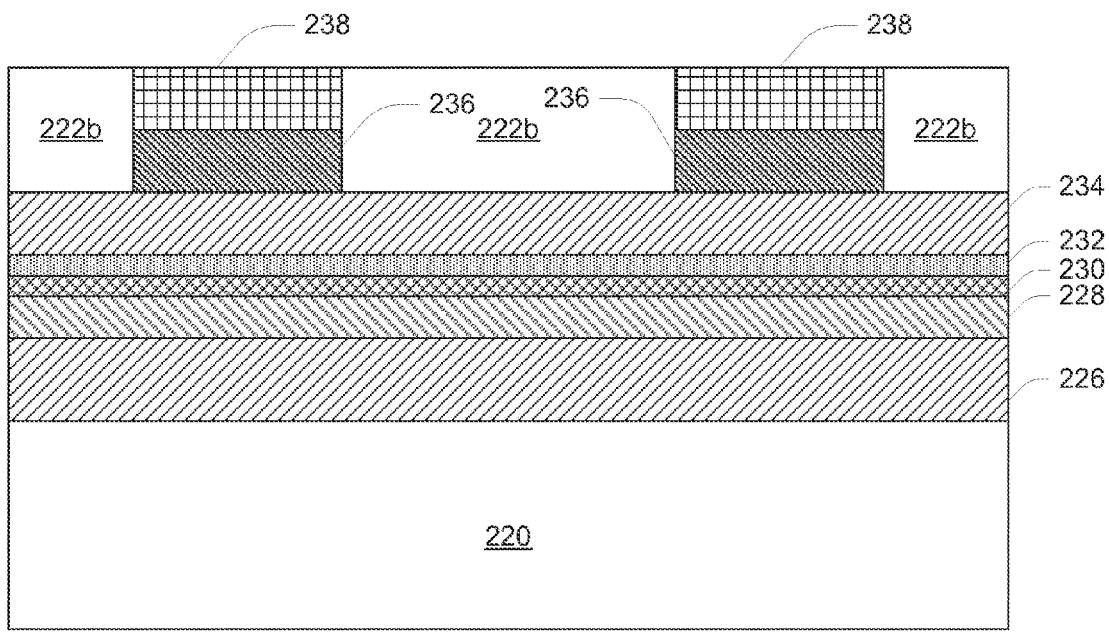

In FIGS. 3H and 4H, first electrodes 232 may be formed over the silicon material 230. The first electrodes 232 are generally formed to contain one or more conductive materials, e.g., metals, metal alloys, conductive metal nitrides, other conductive materials or some combination thereof. For example, the portion of the trenches 224 re-opened upon removing the portion of the silicon material 230 may be filled with the one or more conductive materials of first electrodes 232. Suitable techniques for forming the ruthenium material 228 may include, for example, CVD, PVD, ALD, and electroless plating. As noted with respect to the first conductors 226, filling the trenches 224 with the conductive materials of the first electrodes 232 may extend above an upper surface of the patterned dielectric 222a, and this excess material may be removed, such as by CMP, to planarize the surface.

Following formation of the first electrodes 232, a material capable of variable resistivity 234 is formed over the first electrodes 232. The material capable of variable resistivity 234 may include chalcogenide or other phase-change materials, ferroelectric materials, magnetoresistive materials or other materials whose resistivity can be altered through the application of an appropriate potential difference across the material. Some specific examples include NiO, $Nb_2O_5$, $TiO_2$, $HfO_2$, $Al_2O_3$, MgOx, ZrOx, $CrO_2$, VO, BN and AlN. The foregoing materials are generally considered to be materials capable of reversibly altering their resistivity. The material capable of variable resistivity 234 may further include fusible materials, such that their resistivity can be altered from an initial value to a different value, but not readily restored to its initial value. For example, the material 234 may be an anti-fuse, such that it presents dielectric or semiconductive properties until application of a sufficient potential difference across the anti-fuse allows conductive materials on opposing sides of the anti-fuse to be shorted together. For embodiments such as that depicted in FIGS. 3H and 4H, the material capable of variable resistivity 234 may be formed as a contiguous layer, and may span a length of the first electrodes 232 in one direction and a length of second electrodes 238 in another direction.

Following formation of the material capable of variable resistivity 234, second electrodes 236 may be formed over the material capable of variable resistivity 234. The first electrodes 232, material capable of variable resistivity 234 and second electrodes 236 collectively form resistive elements of the memory cells. The second electrodes 236 are generally formed to contain one or more conductive materials, e.g., metals, metal alloys, conductive metal nitrides, other conductive materials or some combination thereof. Forming second electrodes 236 may include, for example, forming a patterned dielectric 222b, filling trenches with one or more conductive materials, and recessing as was described with reference to the first conductors 226. As further noted with respect to the first conductors 226, filling the trenches with the conductive materials of the second electrodes 236 may extend above an upper surface of the patterned dielectric 222b, and this excess material may be removed, such as by CMP, to planarize the surface. Selection of materials for patterned dielectric 222b may follow the same guidelines as presented with respect to patterned dielectric 222a, although dielectric 222b and dielectric 222a need not be the same dielectric material.

Following formation of the second electrodes 236, second conductors 238 may be formed over the second electrodes 236. The second conductors 238 are generally formed to contain one or more conductive materials, e.g., metals, metal alloys, conductive metal nitrides, other conductive materials or some combination thereof. The second conductors 238 may have the same construction as the first conductors 226. Forming second conductors 238 may include, for example, filling trenches of the patterned dielectric 222b with one or more conductive materials, and removing excess material, such as was described with reference to the first electrodes 232.

As an alternative to the processing described with reference to FIGS. 3A-3H and 4A-4H, structures such as the first conductors 226, ruthenium material 228, silicon material 230, second electrodes 236 and second conductors 238 may be formed by processes other than the processes described herein. Using the first conductors 226 as an example, recessing could avoided by forming the patterned dielectric 222a to the desired height of the first conductors 226, filling the trenches 224 with the one or more conductive materials, and removing any excess, such as by CMP; or by forming the one or more conductive materials to the desired height, patterning to define the first conductors 226, and filling the spaces between the first conductors 226 with dielectric material. Other methods to form the structures described herein will be apparent to those skilled in the art of semiconductor fabrication.

Figure 3J:
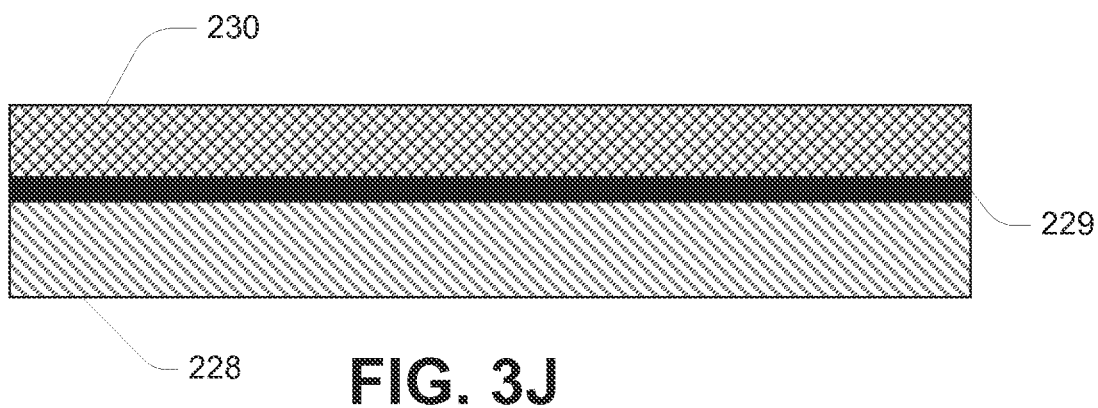
FIG. 3J depicts a cross-sectional view of a diode showing a ruthenium silicide interface on a silicon material in accordance with certain embodiments.

FIG. 3J depicts a cross-sectional view of a diode showing a ruthenium silicide ($Ru_2Si_3$) interface 229 on a silicon material 230 in accordance with certain embodiments. The ruthenium silicide interface 229 is formed on the silicon material 230 between the silicon material 230 and the ruthenium material 228. For various embodiments, the ruthenium silicide interface 229 is a polycrystalline ruthenium silicide. The ruthenium silicide interface 229 may be formed by annealing, e.g., a rapid thermal anneal, the ruthenium material 228 and the silicon material 230, thereby facilitating reaction of ruthenium of the ruthenium material 228 and silicon of the silicon material 230. For example, the structure of FIGS. 3G and 4G may be subjected to a time and temperature sufficient to form a polycrystalline ruthenium silicide interface 229, e.g., a temperature of 500-800° C. in a nitrogen ($N_2$) ambient for 5-30 minutes.

Additional embodiments will now be described with reference to FIGS. 5A-5B, 6A-6B, 7A-7B, 8A-8B and 9A-9B. In these figures, the various stages of fabrication are omitted. However, the structures described therein can be fabricated using the processing as described with reference to FIGS. 3A-3H, 3J and 4A-4H. Unless otherwise noted, guidelines provided with respect to the various elements in conjunction with FIGS. 3A-3H, 3J and 4A-4H are applicable to each of the depicted embodiments.

Figure 5A:
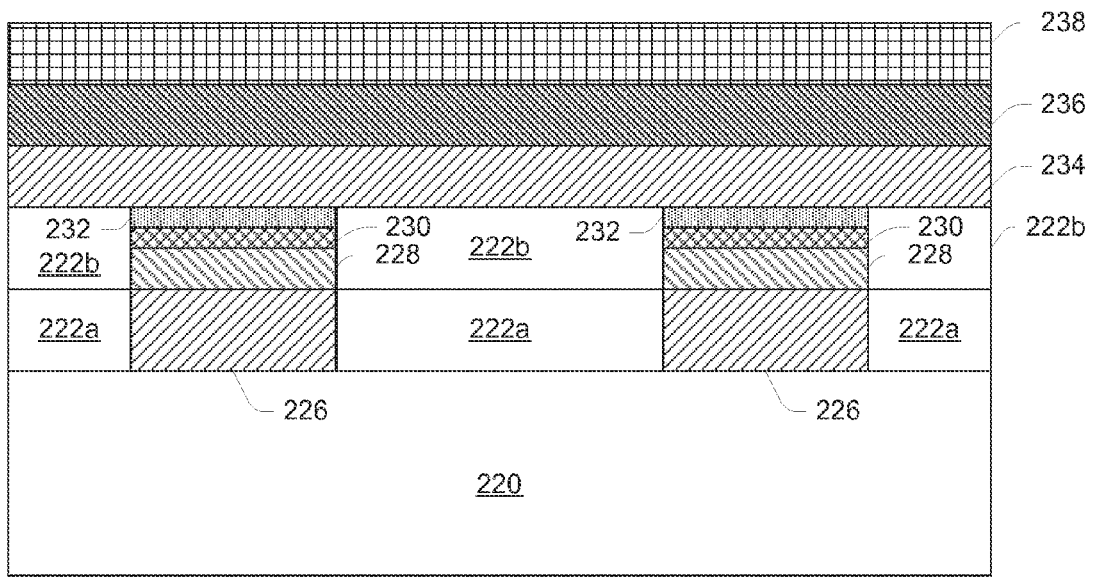
FIGS. 5A and 5B depict cross-sectional views of a portion of a memory array taken along view lines A-A' and B-B', respectively, of FIG. 2 in accordance with an embodiment.
Figure 5B:
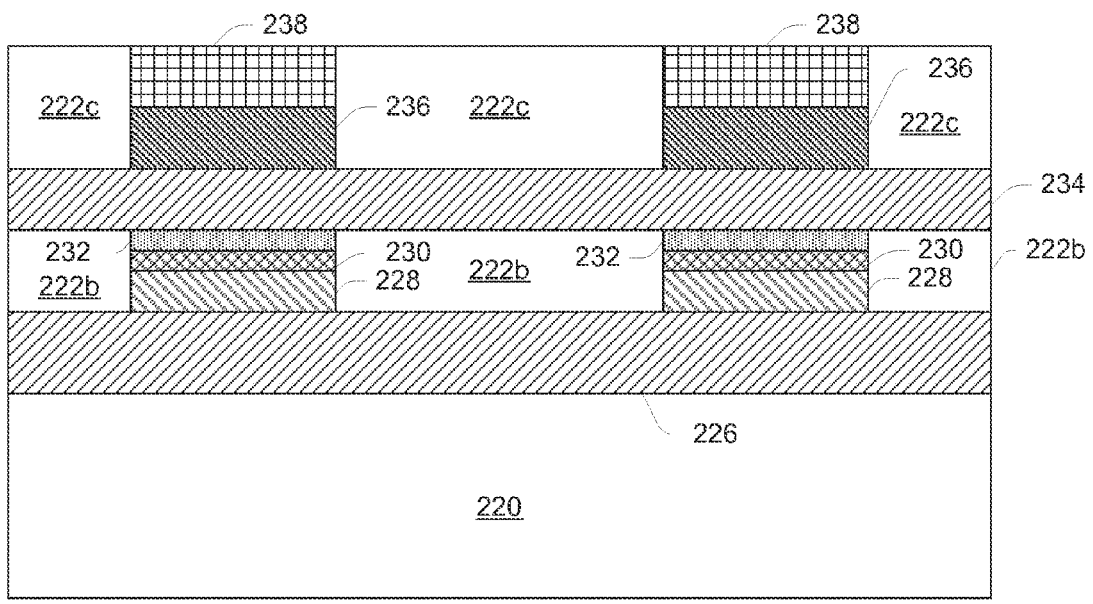

FIGS. 5A and 5B depict cross-sectional views of a portion of a memory array taken along view lines A-A' and B-B', respectively, of FIG. 2 in accordance with an embodiment. For the embodiment depicted in FIGS. 3A-3H and 4A-4H, the diode is in contact with adjacent memory cells in the direction of the first conductors 226, but isolated from adjacent memory cells in the direction of the second conductors 238. For the embodiment depicted in FIGS. 5A and 5B, the diode is isolated from adjacent memory cells in the direction of the first conductors 226 and in the direction of the second conductors 238. Such a structure could be formed by using an additional patterned dielectric, such as patterned dielectric 222b in FIGS. 5A and 5B. For example, a patterned dielectric 222a could be formed to a desired height of the first conductors 226, and the first conductors 226 could be formed. Then a patterned dielectric 222b could be formed to a desired height of the stack of the ruthenium material 228, the silicon material 230 and the first electrode 232, defining vias for subsequent formation of the diodes and the first electrodes 232. The material capable of variable resistivity 234 can be formed as described with reference to FIGS. 3H and 4H, the second electrodes 236 and second conductors 238 could be formed as described with reference to FIGS. 3H and 4H, noting that patterned dielectric 222c of FIG. 5B corresponds to patterned dielectric 222b of FIG. 4H. Although not identified in FIGS. 5A and 5B, a ruthenium silicide interface may be formed between the ruthenium material 228 and the silicon material 230 as described with reference to FIG. 3J.

Figure 6A:
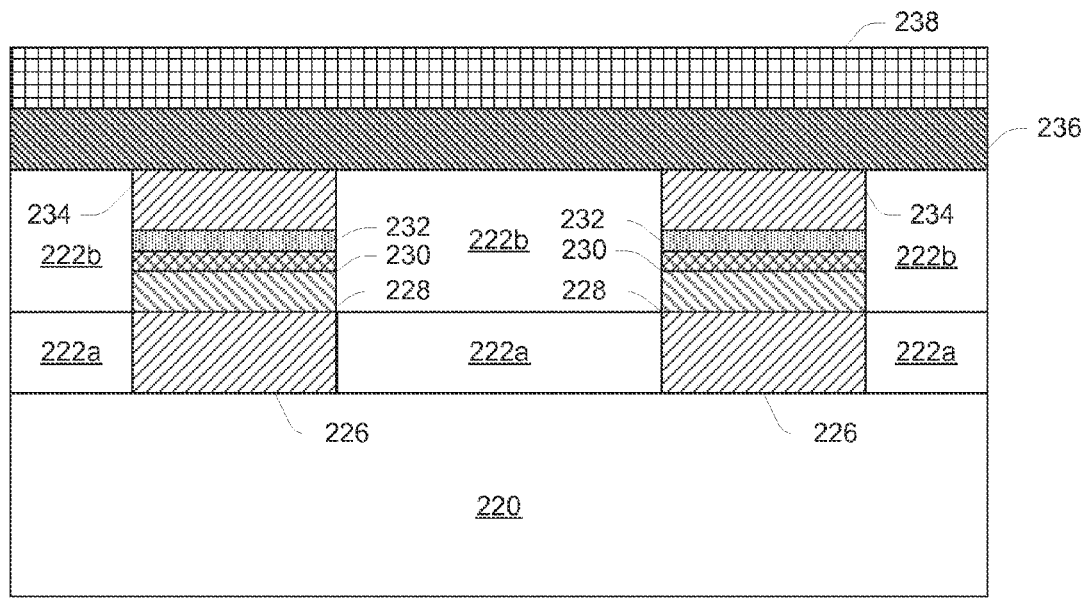
FIGS. 6A and 6B depict cross-sectional views of a portion of a memory array taken along view lines A-A' and B-B', respectively, of FIG. 2 in accordance with an embodiment.
Figure 6B:
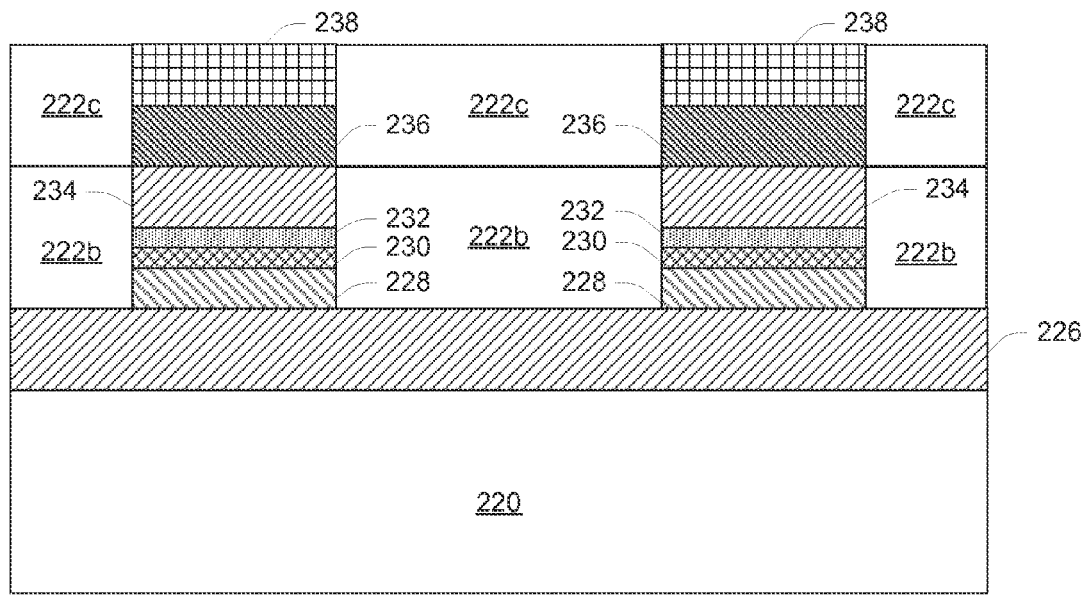

FIGS. 6A and 6B depict cross-sectional views of a portion of a memory array taken along view lines A-A' and B-B', respectively, of FIG. 2 in accordance with an embodiment. For the embodiment depicted in FIGS. 5A and 5B, the material capable of variable resistivity 234 is in contact with adjacent memory cells in the direction of the first conductor 226 and in the direction of the second conductor 238. For the embodiment depicted in FIGS. 6A and 6B, the material capable of variable resistivity 234 is isolated from adjacent memory cells in the direction of the first conductors 226 and in the direction of the second conductors 238. Processing could be similar to that described with reference to FIGS. 5A and 5B, except that the patterned dielectric 222b could be formed to a desired height of the stack of the ruthenium material 228, the silicon material 230, the first electrode 232 and the material capable of variable resistivity 234. Although not identified in FIGS. 6A and 6B, a ruthenium silicide interface may be formed between the ruthenium material 228 and the silicon material 230 as described with reference to FIG. 3J.

Figure 7A:
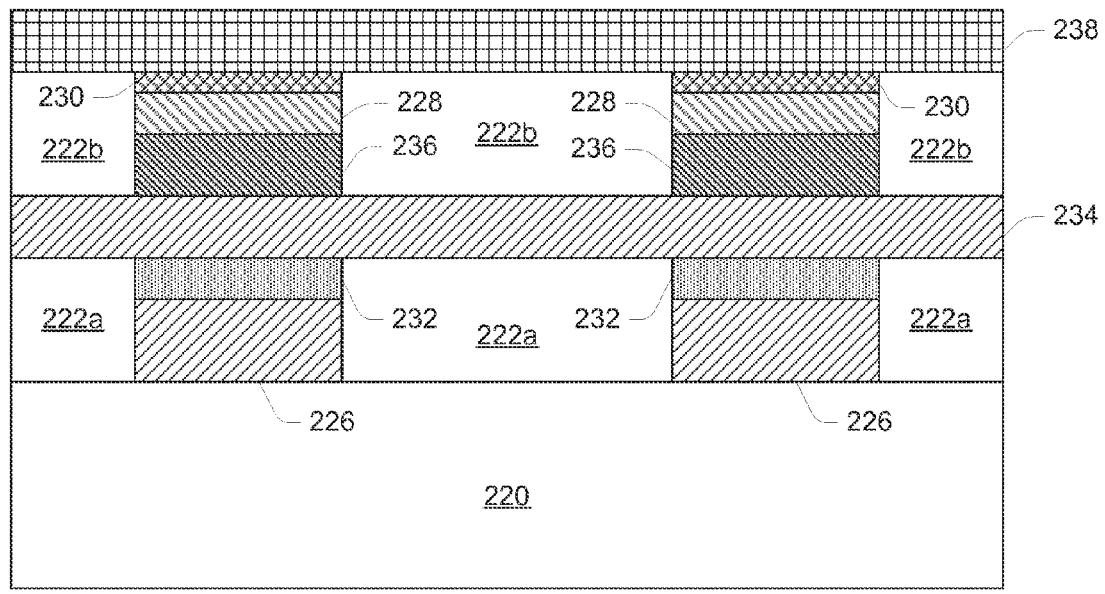
FIGS. 7A and 7B depict cross-sectional views of a portion of a memory array taken along view lines A-A' and B-B', respectively, of FIG. 2 in accordance with an embodiment.
Figure 7B:
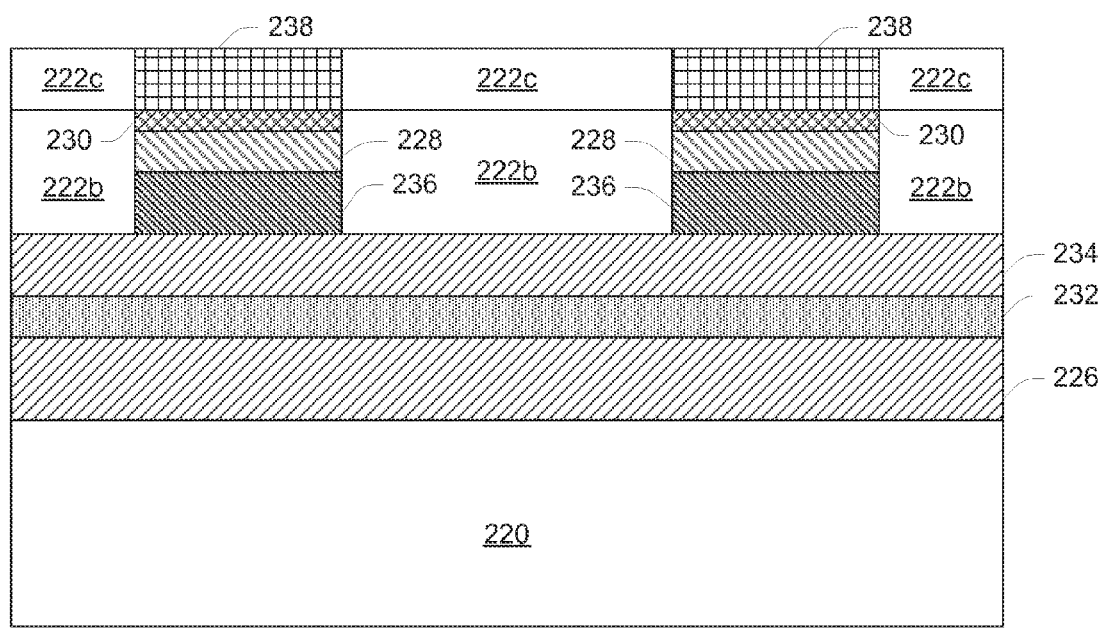

FIGS. 7A and 7B depict cross-sectional views of a portion of a memory array taken along view lines A-A' and B-B', respectively, of FIG. 2 in accordance with an embodiment. For the embodiment depicted in FIGS. 3A-3H and 4A-4H, the diode is between the resistive element and the first conductor 226 of a memory cell. For the embodiment depicted in FIGS. 7A and 7B, the diode is between the resistive element and the second conductor 238 of a memory cell. Furthermore, while the embodiment depicted in FIGS. 3A-3H and 4A-4H has its diode of a memory cell in contact with adjacent memory cells in the direction of the first conductors 226, the embodiment depicted in FIGS. 7A and 7B have diodes that are isolated from adjacent memory cells in the directions of both the first conductors 226 and the second conductors 238. Fabrication of such a structure will be apparent from the foregoing discussion. Although not identified in FIGS. 7A and 7B, a ruthenium silicide interface may be formed between the ruthenium material 228 and the silicon material 230 as described with reference to FIG. 3J.

Figure 8A:
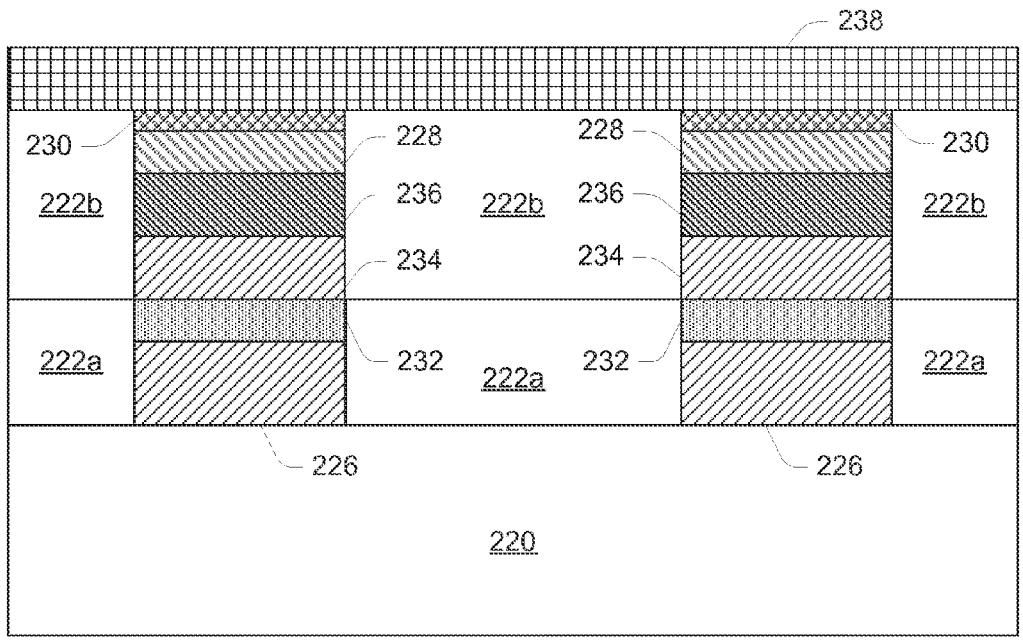
FIGS. 8A and 8B depict cross-sectional views of a portion of a memory array taken along view lines A-A' and B-B', respectively, of FIG. 2 in accordance with an embodiment.
Figure 8B:
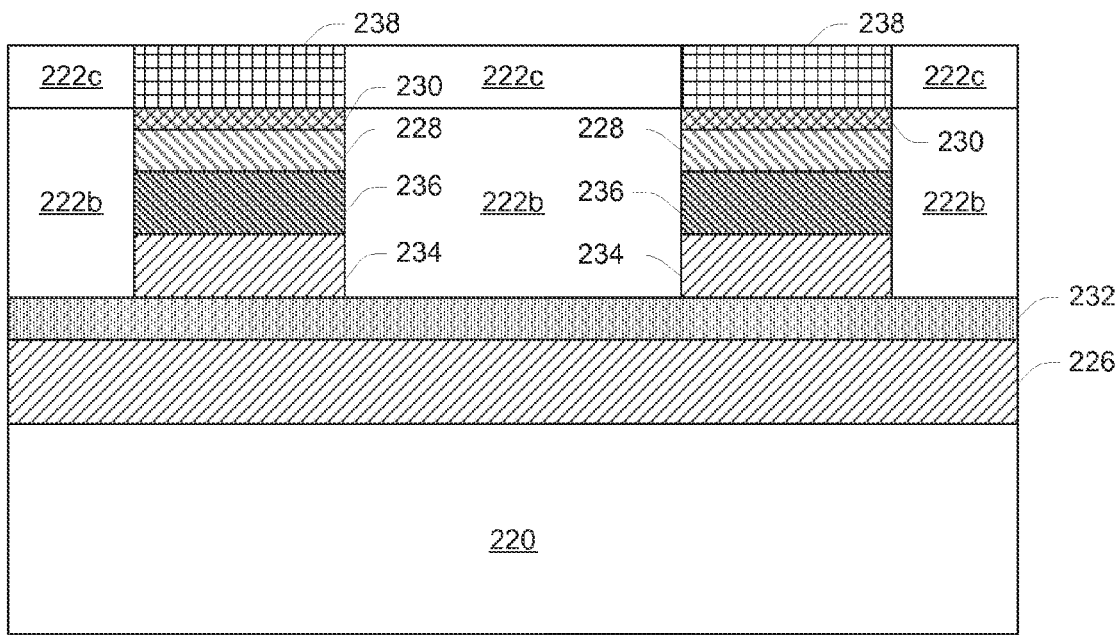

FIGS. 8A and 8B depict cross-sectional views of a portion of a memory array taken along view lines A-A' and B-B', respectively, of FIG. 2 in accordance with an embodiment. For the embodiment depicted in FIGS. 7A and 7B, the material capable of variable resistivity 234 is in contact with adjacent memory cells in the directions of both the first conductors 226 and the second conductors 238. For the embodiment depicted in FIGS. 8A and 8B, the material capable of variable resistivity 234 is isolated from adjacent memory cells in the directions of both the first conductors 226 and the second conductors 238. Fabrication of such a structure will be apparent from the foregoing discussion. Although not identified in FIGS. 8A and 8B, a ruthenium silicide interface may be formed between the ruthenium material 228 and the silicon material 230 as described with reference to FIG. 3J.

Figure 9A:
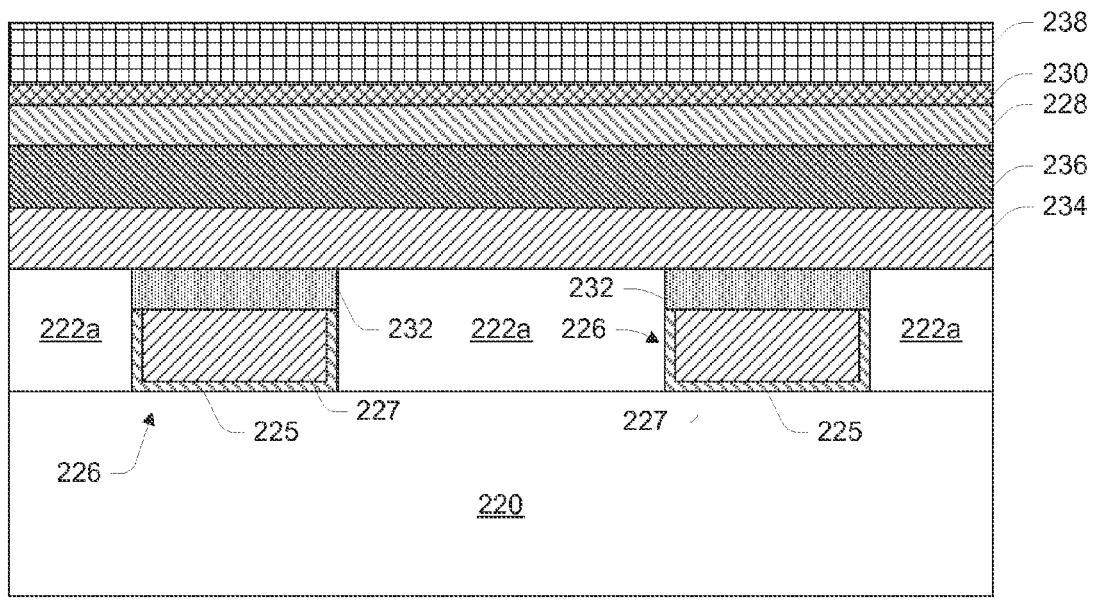
FIGS. 9A and 9B depict cross-sectional views of a portion of a memory array taken along view lines A-A' and B-B', respectively, of FIG. 2 in accordance with an embodiment.
Figure 9B:
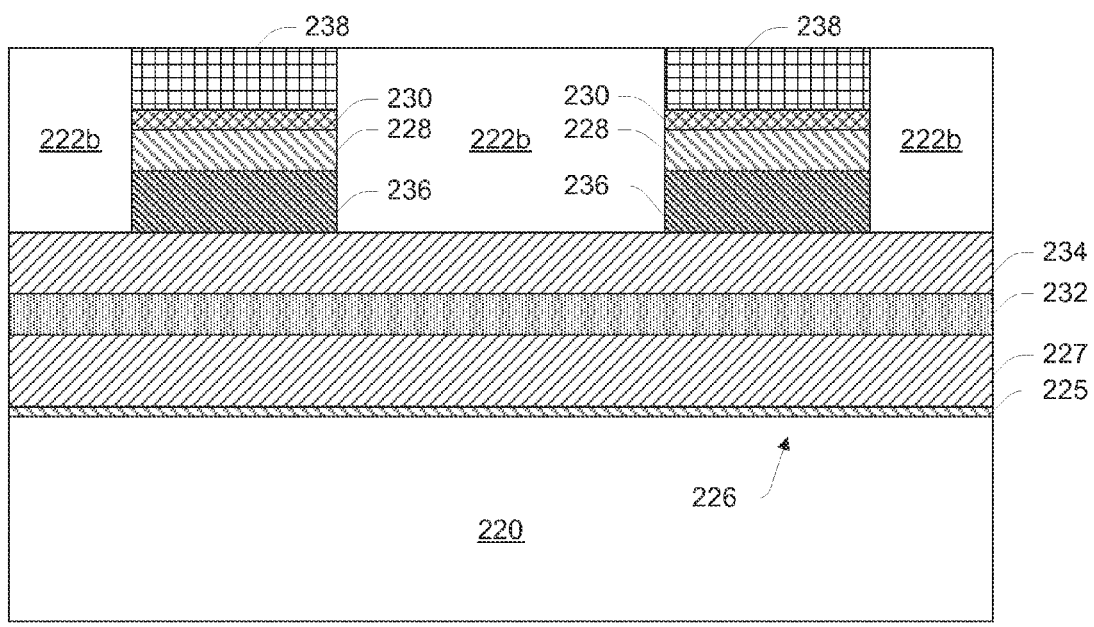

FIGS. 9A and 9B depict cross-sectional views of a portion of a memory array taken along view lines A-A' and B-B', respectively, of FIG. 2 in accordance with an embodiment. The embodiment depicted in FIGS. 9A and 9B shows an example of first conductors 226 formed having a barrier 225 and a conductive material 227 within the barrier. The embodiment depicted in FIGS. 9A and 9B is similar to the embodiment depicted in FIGS. 3A-3H and 4A-4H except that the diodes are formed between the resistive element of a memory cell and a second conductor 238, and that the diodes are in contact with adjacent memory cells in the direction of the second conductors 238, but isolated from adjacent memory cells in the direction of the first conductors 226. Although not identified in FIGS. 9A and 9B, a ruthenium silicide interface may be formed between the ruthenium material 228 and the silicon material 230 as described with reference to FIG. 3J.

It is noted that additional layers may be utilized in the structures described with reference to FIGS. 3A-9B, such as barrier layers to inhibit diffusion between opposing layers, or adhesion layers to promote adhesion between opposing layers.

CONCLUSION

Memory devices have been described utilizing memory cells including a resistive element and a diode coupled in series between two conductors. The diodes include a ruthenium material and a silicon material. The diodes further include an interface on the silicon material of ruthenium or ruthenium silicide. A ruthenium silicide interface may be a polycrystalline ruthenium silicide.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory cell, comprising:
   a first conductor;
   a second conductor;
   a resistive element coupled between the first conductor and the second conductor, wherein the resistive element comprises a first electrode, a second electrode and a material capable of variable resistivity between the first electrode and the second electrode; and
   a diode coupled in series with the resistive element between the first conductor and the second conductor;
   wherein the diode comprises a silicon material;
   wherein the diode further comprises a ruthenium material between the silicon material and the resistive element;
   wherein the diode further comprises an interface between the silicon material and the ruthenium material selected from the group consisting of a ruthenium interface and a ruthenium silicide interface; and
   wherein at least one of the first electrode and the second electrode is in contact with adjacent memory cells in a direction of one of the first conductor and the second conductor.

2. The memory cell of claim 1, wherein the resistive element comprises a fuse or anti-fuse.

3. A memory cell, comprising:
   a first conductor;
   a second conductor;
   a resistive element coupled between the first conductor and the second conductor, wherein the resistive element comprises a material capable of variable resistivity; and
   a diode coupled in series with the resistive element between the first conductor and the second conductor;
   wherein the diode comprises a silicon material;
   wherein the diode further comprises a ruthenium material between the silicon material and the resistive element;
   wherein the diode further comprises an interface between the silicon material and the ruthenium material selected from the group consisting of a ruthenium interface and a ruthenium silicide interface; and
   wherein the material capable of variable resistivity is in contact with adjacent memory cells in at least one direction selected from the group consisting of a direction of the first conductor and a direction of the second conductor.

4. The memory cell of claim 3, wherein the material capable of variable resistivity is isolated from adjacent memory cells in the direction of the first conductor or in the direction of the second conductor.

5. The memory cell of claim 1, wherein the silicon material comprises polycrystalline silicon.

6. The memory cell of claim 1, wherein the first conductor comprises a conductive material formed in a barrier.

7. A memory cell, comprising:
   a first conductor;
   a second conductor;
   a resistive element coupled between the first conductor and the second conductor, wherein the resistive element comprises a material capable of variable resistivity; and
   a diode coupled in series with the resistive element between the first conductor and the second conductor;
   wherein the diode comprises a silicon material and a ruthenium material;
   wherein the diode further comprises an interface between the silicon material and the ruthenium material selected from the group consisting of a ruthenium interface and a ruthenium silicide interface; and
   wherein the silicon material and the ruthenium material of the diode extend to adjacent memory cells in a direction of either the first conductor or the second conductor.

8. The memory cell of claim 7, wherein the silicon material and the ruthenium material of the diode are isolated from the adjacent memory cells in the direction of the first conductor.

9. The memory cell of claim 8, wherein the ruthenium material is between the silicon material and the resistive element.

10. The memory cell of claim 7, wherein the silicon material and the ruthenium material of the diode are isolated from the adjacent memory cells in the direction of the second conductor.

11. The memory cell of claim 10, wherein the silicon material is between the ruthenium material and the resistive element.

12. The memory cell of claim 7, wherein the ruthenium silicide interface is a polycrystalline ruthenium silicide.

13. The memory cell of claim 7, wherein the silicon material is selected from the group consisting of monocrystalline silicon, polycrystalline silicon and amorphous silicon.

14. A memory cell, comprising:
    a first conductor;
    a second conductor;
    a resistive element coupled between the first conductor and the second conductor, wherein the resistive element comprises a first electrode, a second electrode, and a material capable of variable resistivity between the first electrode and the second electrode; and
    a diode coupled in series with the resistive element between the first conductor and the second conductor;
    wherein the diode comprises a ruthenium material and a silicon material;
    wherein the diode further comprises an interface between the silicon material and the ruthenium material selected from the group consisting of a ruthenium interface on the silicon material and a ruthenium silicide interface on the silicon material;
    wherein the first electrode extends to adjacent memory cells in a direction of the first conductor; and
    wherein the second electrode extends to adjacent memory cells in a direction of the second conductor.

15. The memory cell of claim 14, wherein the ruthenium material is between the silicon material and the resistive element.

16. The memory cell of claim 15, wherein the diode is between the resistive element and the second conductor.

17. The memory cell of claim 14, wherein the silicon material is between the ruthenium material and the resistive element.

18. The memory cell of claim 17, wherein the diode is between the resistive element and the first conductor.

19. The memory cell of claim 14, wherein the diode is isolated from adjacent memory cells in at least one direction selected from the group consisting of a direction of the first conductor and a direction of the second conductor.

20. The memory cell of claim 1, further comprising:
    wherein the first electrode is in contact with adjacent memory cells in a direction of one of the first conductor and the second conductor; and
    wherein the second electrode is in contact with adjacent memory cells in a direction of the other one of the first conductor and the second conductor.

* * * * *